United States Patent [19]
Tashiro et al.

[11] Patent Number: 5,763,297
[45] Date of Patent: Jun. 9, 1998

[54] INTEGRATED CIRCUIT CARRIER HAVING LEAD-SOCKET ARRAY WITH VARIOUS INNER DIMENSIONS

[75] Inventors: Kazuhiro Tashiro; Tetsushi Wakabayashi, both of Kawasaki, Japan

[73] Assignee: Fujitsu Limited, Kawasaki, Japan

[21] Appl. No.: 597,113

[22] Filed: Feb. 6, 1996

Related U.S. Application Data

[62] Division of Ser. No. 426,696, Apr. 24, 1995, abandoned, which is a division of Ser. No. 220,037, Mar. 30, 1994, abandoned.

[51] Int. Cl.⁶ .................................................. H01L 21/60
[52] U.S. Cl. ...................... 438/125; 438/106; 439/525; 439/526
[58] Field of Search ................................ 439/525, 526; 437/180, 209; 438/106, 125

[56] References Cited

U.S. PATENT DOCUMENTS

| | | |
|---|---|---|
| 4,033,656 | 7/1977 | Freehauf et al. ............... 439/525 |
| 4,725,692 | 2/1988 | Ishii et al. . |
| 4,733,462 | 3/1988 | Kawatani . |
| 4,753,820 | 6/1988 | Cusack . |
| 4,875,138 | 10/1989 | Cusack . |
| 5,026,303 | 6/1991 | Matsuoka et al. ............... 439/526 |
| 5,381,307 | 1/1995 | Hertz et al. .................... 437/209 |
| 5,481,436 | 1/1996 | Werther ......................... 437/209 |
| 5,556,808 | 9/1996 | Williams et al. ................ 437/209 |

FOREIGN PATENT DOCUMENTS

| | | | |
|---|---|---|---|
| 5-145209 | 6/1993 | Japan ................ | 439/526 |
| 5-145211 | 6/1993 | Japan ................ | 439/526 |

*Primary Examiner*—David Graybill
*Assistant Examiner*—Kevin F. Turner
*Attorney, Agent, or Firm*—Staas & Halsey

[57] ABSTRACT

An IC carrier on which an integrated circuit (IC) package is loaded when electric testing of the IC package is carried out is described. The present invention enables an IC package to be loaded on or unloaded from the IC carrier smoothly without bending any of closely arranged fine leads, and prevents the lead from being deformed by falling impact when it is dropped. According to the present invention, an IC carrier for an IC package having an array of leads comprises an array of socket means for mating with the array of leads, wherein selected one of said socket means differs in an inner dimension from the other ones in the same array. The technique is applicable to both a flat IC package (QFP or SOP) and a pin grid array IC package (PGA).

10 Claims, 8 Drawing Sheets

INTEGRATED CIRCUIT CARRIER HAVING LEAD-SOCKET ARRAY WITH VARIOUS INNER DIMENSIONS

This application is a division of application Ser. No. 08/426,696, filed Apr. 24, 1995, now abandoned, which is a division of application Ser. No. 08/220,037, filed Mar. 30, 1994, now abandoned.

BACKGROUND OF THE INVENTION

1. Field of the Invention

The present invention relates to an integrated circuit (IC) carrier for testing an IC, more specifically to IC carriers for a flat package (QFP, SOP) and a pin grid array package (PGA) having a closely arranged fine lead array.

2. Description of the Prior Art

Figure 1A:
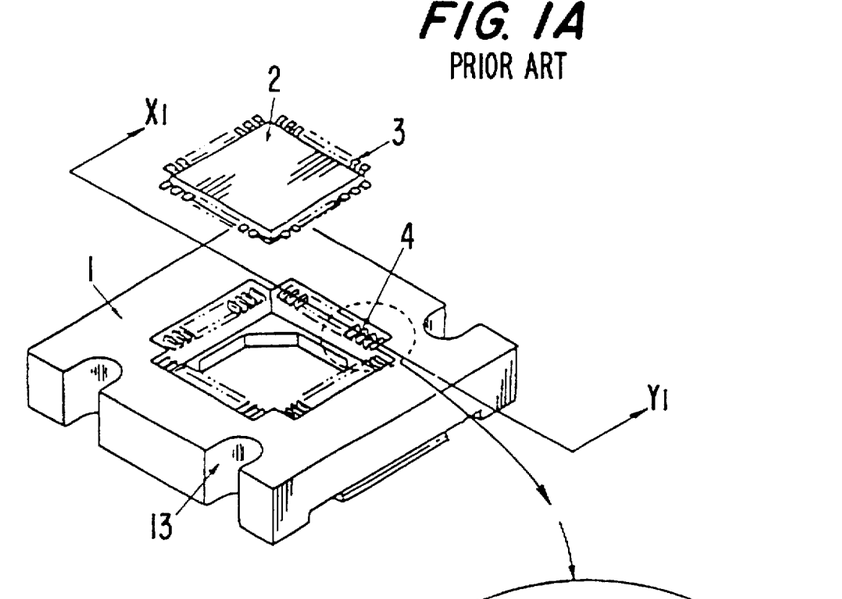
FIG. 1A is a conventional IC carrier with a QFP type package.
Figure 1B:
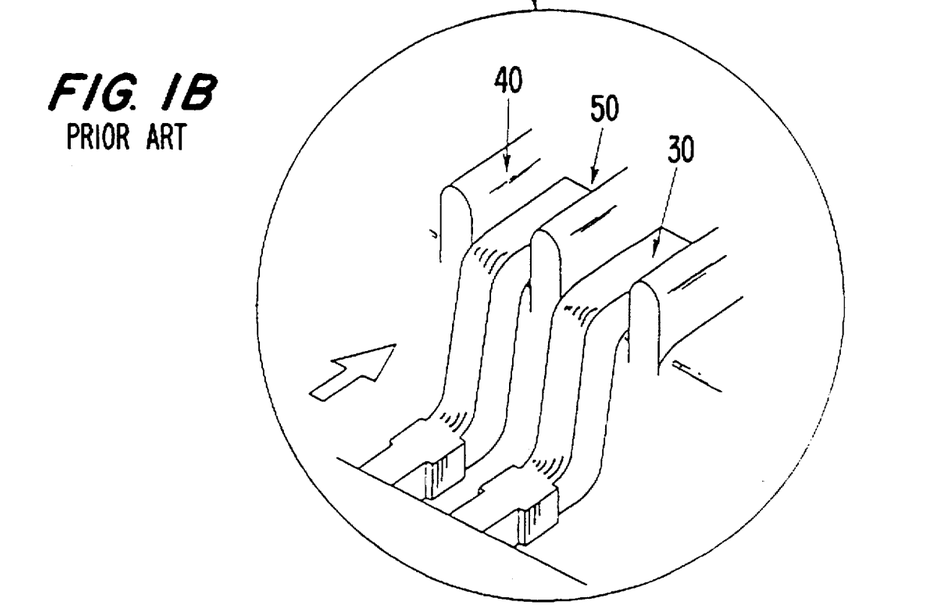
FIG. 1B is an enlarged part of the array of lead sockets with inserted leads shown in FIG. 1A.
Figure 1C:
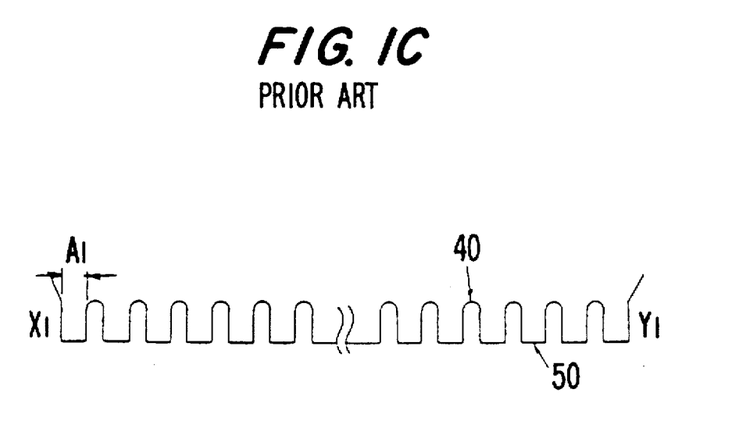
FIG. 1C is a cross-sectional view of the socket array shown in FIG. 1A.
Figure 2A:
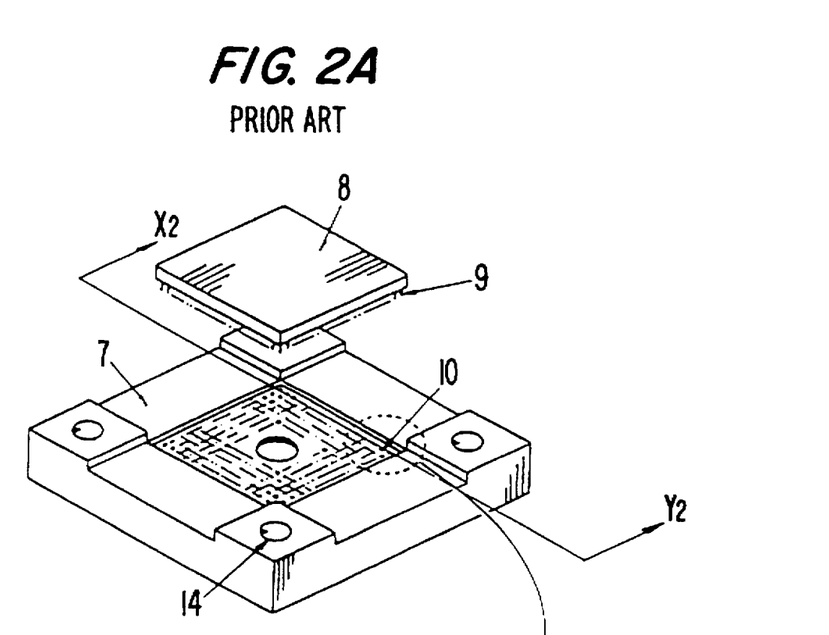
FIG. 2A is a conventional IC carrier with a PGA type package.
Figure 2B:
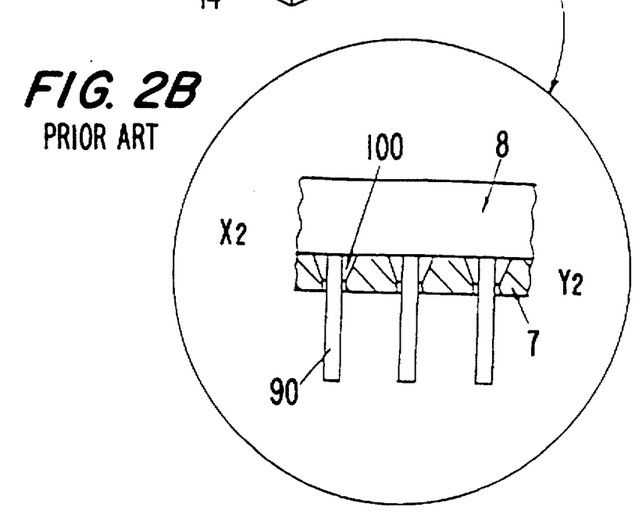
FIG. 2B is an enlarged part of the array of lead sockets with inserted leads shown in FIG. 2A.
Figure 2C:
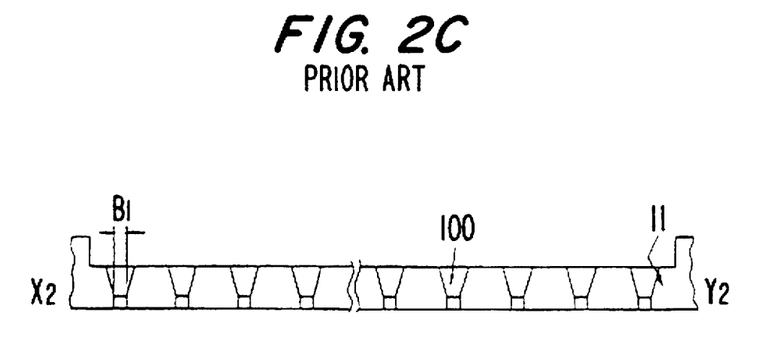
FIG. 2C is a cross-sectional view of the socket array shown in FIG. 2A.

Since it is easy for closely arranged fine leads in an array projected out of an IC package to be bent by handling, electric testing is usually carried out by loading an IC package on an IC carrier. FIG. 1A shows a conventional IC carrier 1 for a QFP type package 2 having a flat lead array 3, and the IC carrier has an array of sockets 4. FIG. 1B shows an enlarged part of the array of sockets where a lead 30 is inserted in a socket 50 between separation walls 40. FIG. 1C shows a cross-sectional view of the socket array by looking at it in the direction of arrows $X_1$ and $Y_1$, indicated in FIG. 1A. All sockets in an array have the same inner width denoted by $A_1$ between separation walls 40. FIG. 2A shows also a conventional IC carrier for a PGA type package 8 having a two dimensional array of leads 9, and the IC carrier has a two dimensional array of sockets 10. FIG. 2B shows an enlarged part of the array of sockets where a lead 90 is inserted into a socket 100. FIG. 2C shows a cross-sectional view of the socket array by looking at it in the direction of arrows $X_2$ and $Y_2$ indicated in FIG. 2A. All sockets 100 in an array have the same inner diameter denoted by $B_1$ with a tapered side-wall 11.

Since each of leads of an IC package in either type is arranged closely and tightly inserted into a socket, the outward stress on the side wall of each socket accumulates successively and resultantly makes the position of sockets in outer portion of an array displace outward considerably. Alternately, when the closely arranged fine leads are inserted in the socket, it often happens at an initial stage of the insertion that leads in some part of an array are already inserted, while leads in some other part of the same array are not inserted yet. Consequently, the uninserted lead may push laterally the separation (or side )wall excessively enough to be deformed. Particularly, if an allowable error in a lead array has an opposite direction to that in the relevant socket array, smooth loading or unloading of IC package becomes harder without deformation of leads.

SUMMARY OF THE INVENTION

It is a primary object of the present invention to provide an IC carrier which an IC package can be smoothly loaded on or unloaded from without deforming its leads.

It is another object of the present invention to provide an IC carrier onto which prevents leads of an IC package from being deformed by falling impact when an IC package loaded on an IC carrier is dropped.

According to the present invention, an IC carrier for either QFP type IC package or PGA type one comprises an array of lead sockets having various inner dimensions for a usual IC package having a lead array of a single inner dimension, and particularly, inner dimensions in an outer part of an array of lead sockets are larger than those in a central part of the array.

DESCRIPTION OF THE PREFERRED EMBODIMENTS

The preferred embodiments of the present invention will now be described in detail with illustrations.

Since IC carriers of the present invention are the same as those of the prior art in their basic structure, outer dimensions, and materials, the cross section $X_1$–$Y_1$ in FIG. 1A or $X_2$–$Y_2$ in FIG. 1B can also represent the cross section of IC carriers according to the present invention. Electric testing of IC packages is carried out in the same way with IC carriers for both the present invention and the prior art. For the testing, an IC package of QFP type 2, and PGA type 8 are loaded on the IC carrier 1 and 7 as shown in FIG. 1A, and FIG. 1B, respectively. Each of IC carriers is further mounted on a testing board with electric connection between leads and sockets by aligning guiding notches 13 of a QFP type IC carrier or holes 14 of a PGA type one to guiding poles of the testing board (not shown).

Figure 3A:
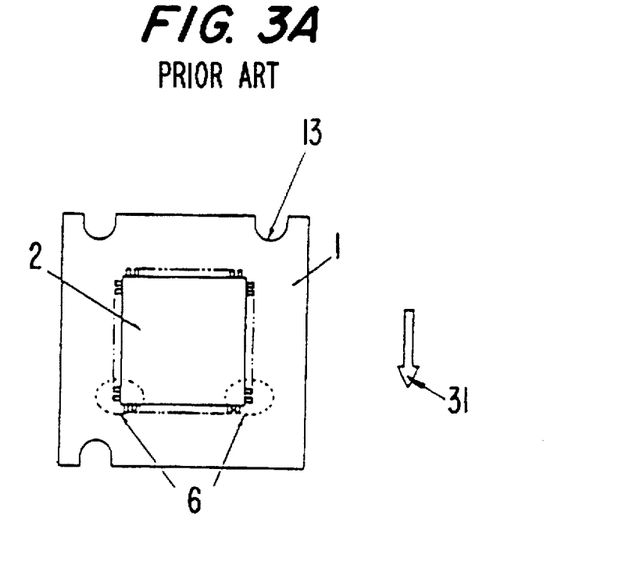
FIG. 3A is an IC carrier loaded with a QFP type package in drop test.

FIG. 3A shows an IC carrier 1 loaded with a PGA type package 2 in drop test. When the IC carrier is dropped in the direction indicated by an arrow 31, deformation of Leads occurs in lower part of vertical arrays of both sides indicated by 6.

Figure 3B:
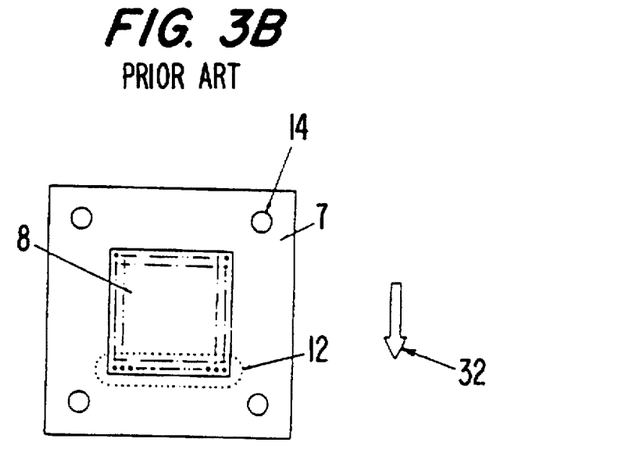
FIG. 3B is an IC carrier loaded with a PGA type package in drop test.

FIG. 3B shows an IC carrier 7 loaded with a PGA type package 8 in a drop test. When the IC carrier is similarly dropped in the direction indicated by an arrow 32, deformation of Leads occurs in an entire part of the lower horizontal array indicated by 12.

Figure 4A:
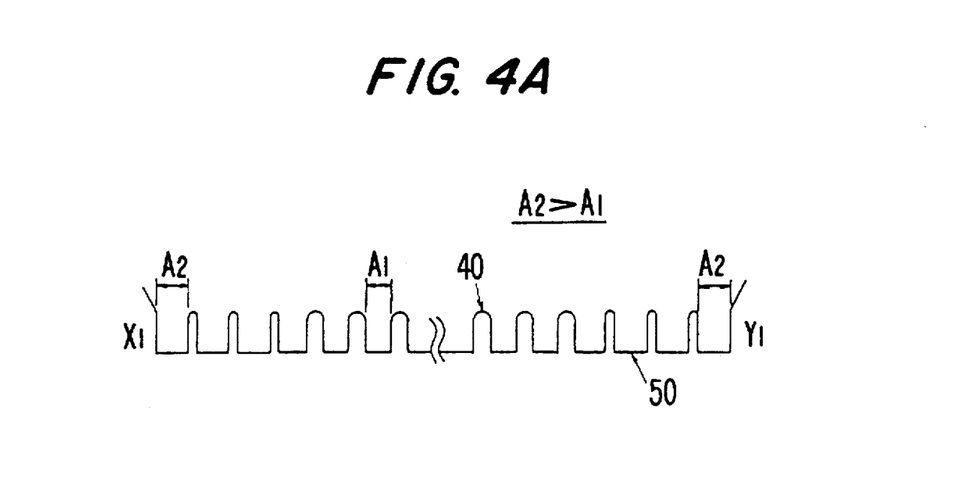
FIG. 4A is a cross-sectional view of a socket array for a QFP type package according to the first embodiment.

FIG. 4A shows a cross-sectional view of a socket array for a QFP type package according to the first embodiment. An inner dimension between the separation walls 40 in an outer part $A_2$ is larger than that in a central part $A_1$. More specifically, an IC carrier is formed by injection mold of heat-resistant engineering plastics such as sulfonic polyether, and for a specific example, $A_1=0.36$ mm, and $A_2=0.40$ mm for a spacing between leads 0.20 mm.

Figure 4B:
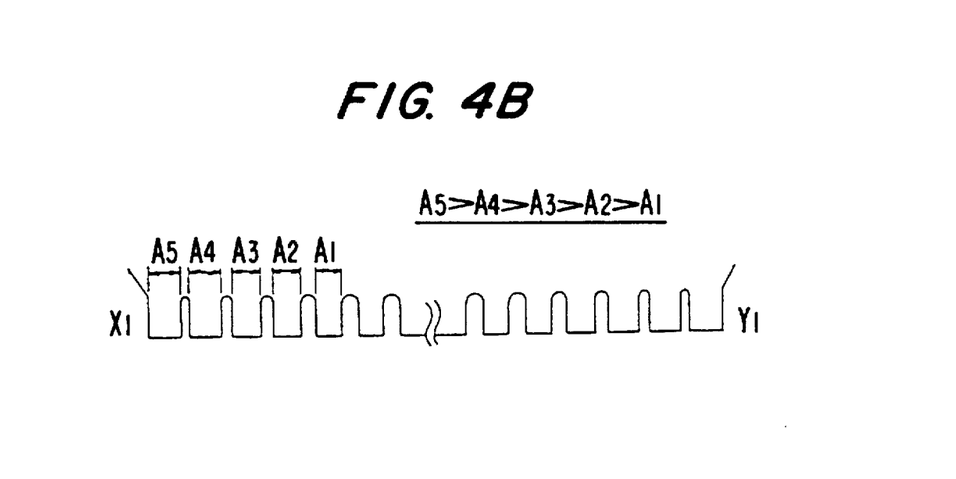
FIG. 4B is a cross-sectional view of a socket array for a QFP type package according to the second embodiment.

FIG. 4B shows a cross-sectional view of a socket array for a QFP type package according to the second embodiment. The inner dimension increases from a central part to outer parts of both sides, namely $A_5>A_4>A_3>A_2>A_1$. For a specific example, $A_5=0.40$ mm and $A_1=0.36$ mm, with an increment 0.01 mm per a socket.

Figure 5A:
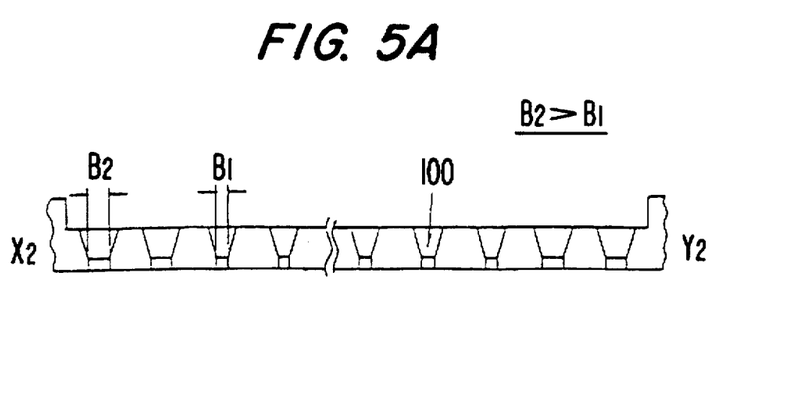
FIG. 5A is a cross-sectional view of a socket array for a PGA type package according to the third embodiment.

FIG. 5A shows a cross-sectional view of a socket array for a PGA type package according to the third embodiment. An inner diameter of a socket 100 in outer parts $B_2$ of both sides is larger than that in a central part $B_1$. For a specific example, $B_1=0.22$ mm, and $B_2=0.25$ mm for a spacing between leads 0.20 mm.

Figure 5B:
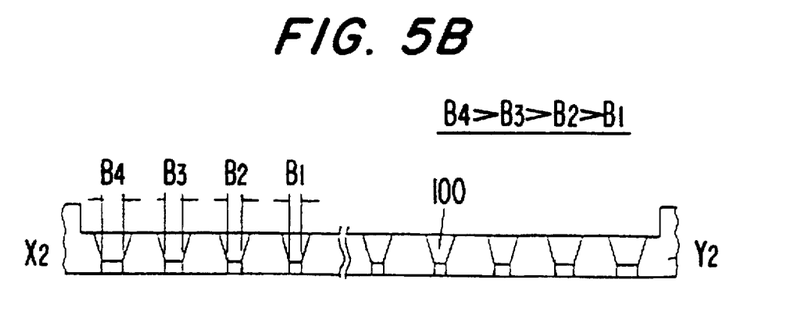
FIG. 5B is a cross-sectional view of a socket array for a PGA type package according to the fourth embodiment.

FIG. 5B shows a cross-sectional view of a socket array for a PGA type package according to the fourth embodiment. An inner diameter increases from a central part to outer parts of both sides, namely $B_5>B_4>B_3>B_2>B_1$. For a specific example, $B_5=0.25$ mm and $B_1=0.22$ mm, with an increment 0.01 mm per a socket.

Figure 6A:
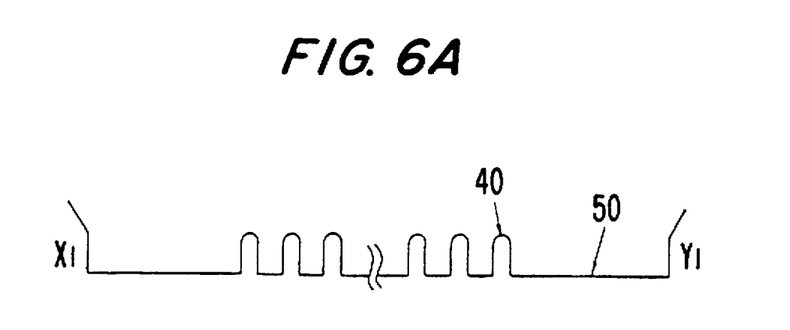
FIG. 6A is a cross-sectional view of a socket array for a QFP type package according to the fifth embodiment.

FIG. 6A shows a cross-sectional view of a socket array for a QFP type package according to the fifth embodiment. Side walls in outer parts of both sides in the socket array are removed. All leads are inserted correctly in each respective socket by aligning to the side-wall in the central part within an allowable error.

Figure 6B:
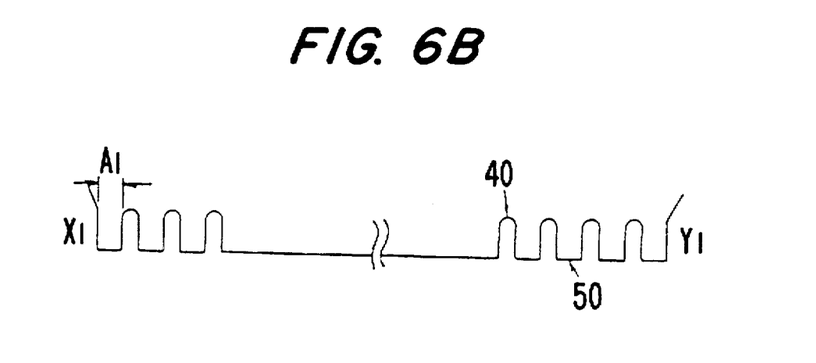
FIG. 6B is a cross-sectional view of a socket array for a QFP type package according to the sixth embodiment.

FIG. 6B shows a cross-sectional view of a socket array for a QFP type package according to the sixth embodiment. Side walls in a central part of the socket array are removed. All leads can be inserted correctly in each respective socket by aligning to the side-wall in outer parts of both sides within an allowable error.

According to the present invention, an IC package can be loaded on and unloaded from the relevant IC carrier easily without bending leads, and leads are protected against falling impact by deconcentrating the impact stress.

What is claimed is:

1. A method for loading an IC package, of a flat type and having an array of leads extending therefrom, onto an IC carrier having an array of sockets respectively corresponding to the array of leads, each of the sockets being defined by a pair of adjacent, opposing side walls having a space therebetween defining a corresponding width of the respective socket and at least one socket having a smallest such width, relative to the widths of remaining sockets of the array, and of a size capable of receiving only one lead, the sockets receiving respective leads in mating relationship therein and each socket of the smallest such width being capable of receiving only a single respective lead therein, the method comprising the steps of:

aligning a lead, of the array of leads, corresponding to a socket of smallest width, of the array of sockets, with a selected one of the opposing sidewalls of the corresponding socket; and inserting the plurality of leads, of the array thereof, into the respectively corresponding sockets, of the array thereof, by inserting the aligned lead into the respective socket of smallest width.

2. A method as recited in claim 1 wherein the array of sockets comprises plural sockets disposed in laterally adjacent, aligned relationship and comprising at least one central socket and at least first and second opposite end sockets, the method further comprising:

aligning the lead, corresponding to the control socket of smallest width, with a selected sidewall of the central socket of smallest width; and inserting the plurality of leads, of the array thereof, into the respectively corresponding sockets, of the array thereof, by inserting the aligned lead into the central socket of smallest width.

3. A method as recited in claim 1 in which the array of sockets comprises plural sockets disposed in laterally adjacent, aligned relationship and ranging in respective widths from at least one central socket of the smallest width to opposite end sockets of greatest widths, the method further comprising:

aligning the lead, corresponding to the control socket of smallest width, with a selected sidewall of the central socket of the smallest width; and inserting the plurality of leads, of the array thereof, into the respectively corresponding sockets, of the array thereof by inserting the aligned lead into the central socket of smallest width.

4. A method as recited in claim 1, wherein each socket of the array of sockets is of a size capable of receiving only one lead and receives, in mating relationship therein, a corresponding, individual lead.

5. A method for loading an IC package, of a flat type and having array of leads extending therefrom, onto an IC carrier having an array of sockets respectively corresponding to the array of leads, each of the sockets being defined by a pair of adjacent, opposing side walls having a space therebetween defining a corresponding width of the respective socket, the array of sockets further comprising at least one first socket corresponding to, and having a width for receiving therein a respective first plurality of leads and plural second sockets corresponding to a second plurality of leads, each second socket having a width smaller than a width of the first socket and receiving only a respective, individual lead of the second plurality of leads in mating relationship therein, the method comprising the steps of:

aligning a lead, of the array of leads, corresponding to a second socket of smallest width, of the array of sockets, with a selected one of the opposing sidewalls of the corresponding second socket; and inserting the first and second leads, of the array thereof, into the respectively corresponding first and second sockets, of the array thereof, by inserting the aligned lead into the corresponding socket of smallest width.

6. A method as recited in claim 5, wherein the plural second sockets are disposed in a central portion of the array of sockets, separating first and second spaced portions of the first socket, the method further comprising the steps of:

aligning the lead, corresponding to the central socket of smallest width, with a selected one of the opposing sidewalls of the corresponding second socket; and inserting the plurality of leads, of the array thereof, into the respectively corresponding first and second sockets, of the array thereof, by inserting the aligned lead into the corresponding socket of smallest width.

7. A method as recited in claim 5 wherein the first socket is disposed in a central portion of the array of sockets, separating the plural second sockets into first and second portions, each portion of plural second sockets, the method further comprising the steps of:

aligning the lead, corresponding to the central socket of smallest width, with the selected one of the opposing sidewalls of the corresponding second socket; and inserting the plurality of leads, of the array thereof, into the respectively corresponding first and second sockets, of the array thereof, by inserting the aligned lead into the respective socket of smallest width.

8. A method for loading an IC package, of a pin grid array type having a grid array of leads extending therefrom, on an IC carrier having a grid array of sockets respectively corresponding to the grid array of leads, each socket comprising a conical part which is inwardly tapered and extends from an upper surface of the IC carrier to, and joins, an interior cylindrical part thereof, at least one socket having a corresponding interior cylindrical part of smallest diameter relative to respective diameters of corresponding cylindrical parts of the remaining sockets of the array, the sockets receiving respective leads in mating relationship therein, the method comprising the steps of:

aligning a lead with a selected surface of a cylindrical part of, a corresponding socket, having the smallest diameter;

aligning the lead with a selected surface portion of the conical part of the corresponding socket,; and inserting the plurality of leads, of the array thereof, into the respectively corresponding sockets, of the array thereof, by inserting the aligned lead into the conical part and subsequently into the cylindrical part of the corresponding socket.

9. A method as recited in claim 8, wherein the array of sockets comprises plural sockets disposed in laterally adjacent, aligned relationship and comprising at least one central socket and at least first and second opposite end sockets, the at least one socket having a smallest width being a central socket, the method further comprising:

aligning the lead, corresponding to the central socket of smallest width, with a selected sidewall surface of the corresponding central socket of smallest width; and guiding the aligned lead along the selected sidewall of the corresponding central socket of smallest width, thereby inserting the aligned lead into the central socket of smallest width and inserting the plurality of leads, of the array thereof, into the respectively corresponding sockets, of the array thereof.

10. A method as recited in claim 8 in which the array of sockets comprises plural sockets disposed in laterally adjacent, aligned relationship and ranging in respective widths from at least one central socket of smallest width to opposite end sockets of greatest widths, the method further comprising:

aligning the lead, corresponding to the central socket of smallest width, with a selected sidewall surface of the corresponding central socket; and inserting the plurality of leads, of the array thereof, into the respectively corresponding sockets, of the array thereof, by inserting the aligned lead into the corresponding socket of smallest width.

* * * * *

UNITED STATES PATENT AND TRADEMARK OFFICE
CERTIFICATE OF CORRECTION

PATENT NO. : 5,763,297
DATED : June 9, 1998
INVENTOR(S) : Kazuhiro Tashiro et al.

Page 1 of 1

It is certified that error appears in the above-identified patent and that said Letters Patent is hereby corrected as shown below:

Title Page, Column 1, insert:

[30] Foreign Application Priority Data
July 5, 1993 [JP] Japan ..........5-164918

Column 1,
Line 30, after "carrier" insert --7--.

Signed and Sealed this

Tenth Day of July, 2001

*Attest:*

Nicholas P. Godici

*Attesting Officer*

NICHOLAS P. GODICI
*Acting Director of the United States Patent and Trademark Office*